United States Patent [19]

Colak

[11] Patent Number: 4,894,832
[45] Date of Patent: Jan. 16, 1990

[54] WIDE BAND GAP SEMICONDUCTOR LIGHT EMITTING DEVICES

[75] Inventor: Sel B. Colak, Ossining, N.Y.

[73] Assignee: North American Philips Corporation, New York, N.Y.

[21] Appl. No.: 244,379

[22] Filed: Sep. 15, 1988

[51] Int. Cl.⁴ .............................................. H01S 3/19
[52] U.S. Cl. ........................................ 372/44; 372/50
[58] Field of Search ................... 372/43, 44, 45, 50, 372/74; 357/16, 17, 88, 89

[56] References Cited

U.S. PATENT DOCUMENTS

| | | | |
|---|---|---|---|
| 3,382,454 | 5/1968 | Wade et al. | 372/43 |
| 3,493,891 | 2/1970 | Fern et al. | 357/89 |
| 3,673,514 | 6/1972 | Coleman, Jr. et al. | 357/89 |
| 3,871,017 | 3/1975 | Pratt, Jr. | 372/44 |
| 4,300,107 | 11/1981 | Copeland, III | 372/44 |
| 4,461,007 | 7/1984 | Burnham et al. | 372/45 |
| 4,577,321 | 3/1986 | Carney et al. | 372/45 |
| 4,620,132 | 10/1986 | Gordon et al. | 315/3 |
| 4,631,731 | 12/1986 | Wolter et al. | 372/74 |

FOREIGN PATENT DOCUMENTS 0297654 1/1989 European Pat. Off. .

OTHER PUBLICATIONS

Basov et al; "Semiconductor Streamer Lasers"; IEEE J. of Quan. Elec., vol. QE-13, No. 8; 08/1977; pp. 699-704.

Primary Examiner—Frank Gonzalez
Attorney, Agent, or Firm—John C. Fox

[57] ABSTRACT

Wide band gap, single conductivity type semiconductor light emitting diodes (LED's) feature a bias potential across the device below that required for carrier multiplication by avalanche breakdown, together with separate means for carrier introduction, such as an electron beam of a pn junction diode, to achieve light emission. The addition of Fabry-Perot surfaces converts the LED to a semiconductor laser. Efficiency enhancing heterostructure, including potential wells and staircases, may be added to the device. Arrays of such devices on a substrate may be scanned by an electron beam to display video information.

18 Claims, 3 Drawing Sheets

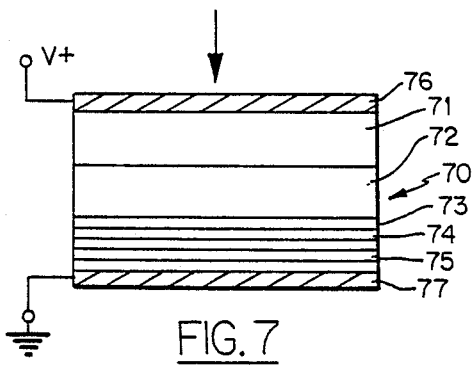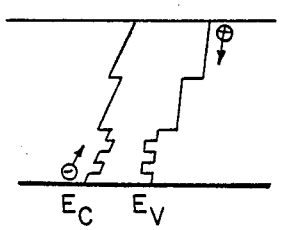
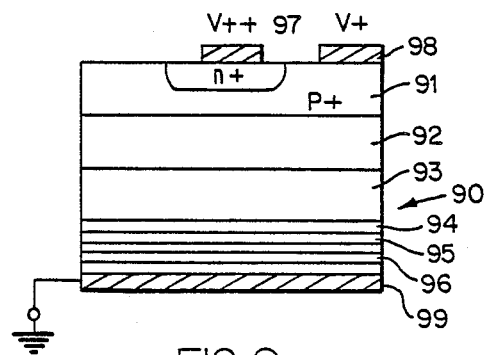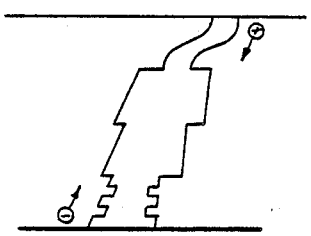
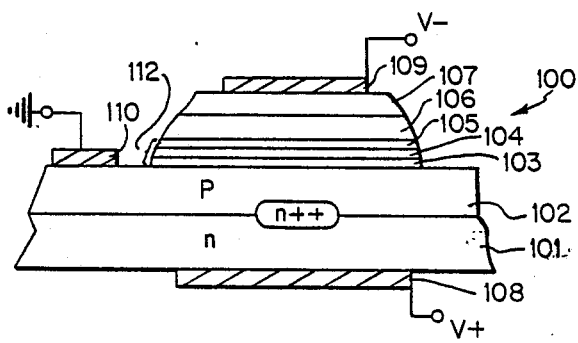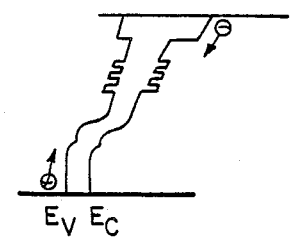

WIDE BAND GAP SEMICONDUCTOR LIGHT EMITTING DEVICES

BACKGROUND OF THE INVENTION

This invention relates to wide band gap semiconductor light emitting devices (LED's), and also relates to such devices including a Fabry-Perot cavity to achieve laser output.

Semiconductor LED's fabricated from wide band gap materials such as II-VI compounds, are desirable in that they emit radiation at wavelengths within the visible region of the electromagnetic spectrum. However, at the present time, it is difficult to make pn junction LED's from wide band gap semiconductor materials, since suitable materials can generally only be properly doped either with n-type or p-type conductivity.

Despite these drawbacks, lasing has nevertheless been achieved in devices utilizing wide band gap semiconductor materials of a single conductivity type, usually by avalanche breakdown brought on by a high field potential, for example in the vicinity of a boundary between regions of different conductivities. In this regard, see Fern et al., U.S. Pat. No. 3,493,891 (p-GaAs), and Mimura, Japanese patent application No. 54-14470 (n-GaAs). Lasing in such single conductivity type materials has also been achieved by a high field potential induced behind the ionization front of a streamer. See N. G. Basov et al., *Semiconductor Streamer Lasers*, J. Quantum Electronics, Vol. QE-13, No. 8, August 1988 ($Cd_xSe_{1-x}$ and ZnSe). In addition, lasing has been reported by means of direct carrier injection from a Schottky diode. See Wade, U.S. Pat. No. 3,382,454 (p-GaAs). Lasing is also generally known to be achieveable in such materials by pumping optically or with a high energy electron beam.

Electron beam excitation of II-VI materials is of particular interest for display applications, such as video, since the technology for scanning a display screen with electron beams is well developed, and since the band gap energies of these materials are such that well defined emissions within the visible spectrum are obtainable. However, the efficiencies of LED's using such single conductivity type materials are less than could be obtained if such materials could be doped both n- and p-type, to obtain pn junctions. For such single conductivity-type materials, the electron beam energies required to achieve carrier multiplication by avalanche breakdown, the most efficient mode of operation, would be practically prohibitive.

Accordingly, it is an object of the invention to provide wide band gap, single conductivity type, semiconductor LED's which can be excited by electron beams at energies below those previously required.

It is another object of the invention to provide wide band gap, single conductivity type, semiconductor lasers which can be excited by electron beams at energies lower than those previously required.

It is still another object of the invention to provide wide band gap, single conductivity type, semiconductor LED's and lasers having enhanced efficiencies of operation.

It is still another object of the invention to provide wide band gap, single conductivity type, semiconductor heterostructure LED's and lasers having enhanced efficiencies of operation.

SUMMARY OF THE INVENTION

According to one aspect of the invention, wide band gap single conductivity type semiconductor LED's are provided in which a potential below the threshhold required for carrier multiplication by avalanche breakdown is applied, enabling the excitation of light emission by carrier introduction at a lower energy than would otherwise be required. Such carrier introduction may be by means of an incident beam of electrons or electromagnetic radiation, such as light, or by carrier injection, such as from a pn junction diode or Schottky diode.

In accordance with another aspect of the invention, wide band gap, single conductivity type semiconductor LED's are provided with efficiency-enhancing heterostructures such as potential wells or staircases, or a combination of potential wells and staircases, in order to enhance the efficiency of carrier multiplication and/or recombination in such devices.

In accordance with still another aspect of the invention, such a device employs a carrier injection structure formed in a substrate of a single crystal semiconductor material suitable to support epitaxial growth of the wide band gap semiconductor homostructure or heterostructure, such structure herein generically termed the "active region" of the device. Such a device may be one of an array of devices formed on the substrate, in which both the carrier injection structure and the active regions are formed, for example, by techniques well known in the integrated circuit art. For example, the epitaxially grown layers of a heterostructure covering the entire surface of the substrate can be separated into an array of separate active regions by masking areas corresponding to the desired active regions and then etching away the exposed portions with an etchant selective for the materials in the epitaxial layers of the heterostructure. Such an array, when the individual devices thereof are subjected to a potential below that required for avalanche breakdown, and subsequently addressed by a scanning electron beam, is useful in a display device such as a video display device.

In accordance with yet a further aspect of the invention, parallel reflective surfaces may be provided for such devices, these surfaces forming a Fabry-Perot cavity for the carrier recombination region of the active region of the device in order to induce lasing of the emitted light. In such laser devices, the electrodes may be partially transmitting or in the alternative, may be located outside the path of the laser light in order to avoid absorption and/or attenuation of such light by the electrode materials.

BRIEF DESCRIPTION OF THE DRAWINGS

FIG. 7 is a section view similar to that of FIG. 1 for another embodiment of the invention in which the efficiencies of the devices of FIGS. 3 and 5 are enhanced by combining potential wells with staircases;

FIG. 8 is a potential diagram for the device of FIG. 7;

FIG. 9 is a section view of another embodiment of an LED of the invention, in which the electron beam of FIG. 7 has been replaced by a pn junction diode;

FIG. 10 is an energy diagram for the device of FIG. 9;

FIG. 11 is a section view of another embodiment of an LED of the invention, in which a pn junction is formed in a single crystal substrate material, and an active region is epitaxially formed on the surface of the substrate;

FIG. 12 is an energy diagram for the device of FIG. 11;

DESCRIPTION OF THE PREFERRED EMBODIMENT

As used herein, the term "wide band gap semiconductor materials" means semiconductor compositions based on compounds of elements selected from group II and group VI, and from group III and group V of the Periodic Table. Examples of II-VI compounds include zinc sulphide (ZnS), zinc selenide (ZnSe), cadmium sulphide (CdS) and cadmium selenide (CdSe). Mixed compounds in which either the group II cation or the group VI anion or both are partially replaced by one or more other group II cations or group VI anions respectively, are also included. Examples are (Zn,Cd)S, Zn(S,Se), etc. Such wide band gap semiconductor materials also include compositions based on group III-V compounds, such as gallium arsenide (GaAs), gallium nitride (GaN), aluminum nitride (AlN) and indium phosphide (InP), and mixed compounds of these materials in which the group III cation or the group V anion or both are partially replaced by one or more of the other group III cations or group V anions.

Such mixed compounds are useful in forming heterostructures having layers of discrete or varying band gap energies, (band gap is the difference between the energy of the conduction band and the valence band of a material) tailored to a specific device application.

Figure 1:
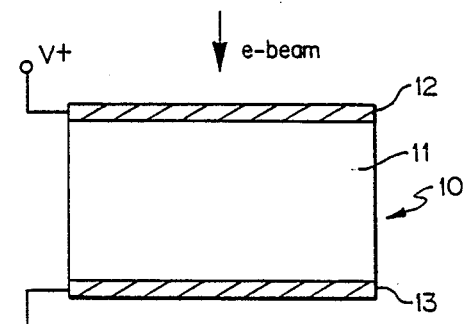
FIG. 1 is a section view of one embodiment of a LED according to the invention, in which the device is subjected to a potential below that required for light emission, and in which light emission is excited by an electron beam incident on the device.

Referring now to FIG. 1 of the drawing, there is shown a cross-section of one embodiment of a wide band gap semiconductor LED of the invention 10, in which active material 11 is sandwiched between electrodes 12 and 13. Active material 11 could be, for example, n-ZnSe. A positive potential is impressed across this material by applying a positive voltage to electrode 12 and connecting electrode 13 to ground. Such positive potential alters the band gap of the active material so as to favor light emission upon impingement of an electron beam, indicated by the arrow, on the device.

Figure 2:
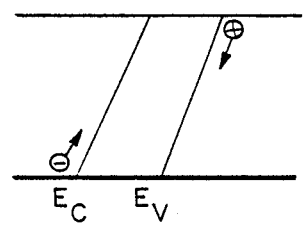
FIG. 2 is a energy diagram for the active region of the device of FIG. 1, showing the variation in band gap energy across the device.

FIG. 2 represents diagrammatically an energy diagram for the active region of the device of FIG. 1, in which Ec is the energy level of the conduction band and Ev is the energy level of the valence band of the material. Electrons (the majority carriers in an n-type material) move in the conduction band in a direction away from the grounded electrode 13 and toward the positive electrode 12, while holes (minority carriers) move along the valence band in a direction away from the positive electrode 12 and toward the grounded electrode 13. Electron-hole pairs are produced when an electron beam, designated by the arrow in FIG. 1, is incident upon one surface of the device. As these electron-hole pairs recombine, energy is given off in the form of light emission. As the potential increases, more and more electron-hole pairs are produced, thus increasing the number of possible carrier recombinations, and accordingly, the amount of light emitted by the device. When the potential is held at a level just below that needed for carrier multiplication by avalanche breakdown, an electron beam incident on the device will initiate such an avalanche condition.

As is known, avalanche refers to a process in which charge carriers are produced having sufficient energies to themselves produce additional charge carriers, whereby the number of carrier pairs and subsequent carrier recombinations is increased, which may result in both increased efficiency and light output of the device.

Figure 3:
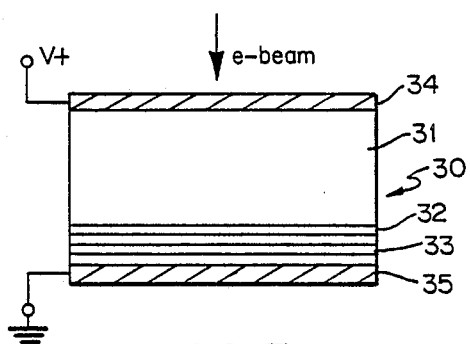
FIG. 3 is a section view similar to that of FIG. 1 for another embodiment of an LED of the invention, in which the efficiency of the device of FIG. 1 is enhanced by the addition of potential wells.

FIG. 3 is a cross-section of another embodiment of an LED of the invention, in which the efficiency of the device of FIG. 1 is enhanced by aiding potential wells to the active region. The device 30 thus includes an active material 31 in which potential wells 32 and 33 are located and which is sandwiched between electrodes 34 and 35, held at positive and ground potentials, respectively. Where the active material is, for example, $ZnS_xSe_{1-x}$, the potential wells may be ZnSe, where x is within the range of about 0.1 to 0.3. Such an active region containing potential wells may be produced by epitaxial deposition of a layer of the active material 31, followed by epitaxial deposition of a layer of the potential well 33, followed by the deposition of another layer of active material 31, followed by the deposition of another potential well layer 32, followed by the deposition of the remainder of active region 31. The thicknesses of the potential wells could, for example, be in the vicinity of a few hundred angstroms, while the overall thickness of the active region could be on the order of 5 to 20 microns.

Figure 4:
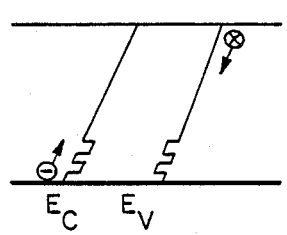
FIG. 4 is an energy diagram for the device of FIG. 3.

The composition of the potential wells is chosen so that the band gap of these wells is less than that of the surrounding material of the active region. The resulting energy diagram for such a device is depicted in FIG. 4, wherein the notches in the lower portions of the conduction and valence bands correspond in position to the potential wells in the active region and represent the lower band gap of these potential wells.

In operation of the device, as electrons and holes move in the directions indicated, many of these charge carriers become trapped in the potential wells, as a result of which carrier recombination and light emission are concentrated in these potential wells. Such charge carrier trapping allows carrier relaxation and recombination with greater efficiency than would otherwise occur in a homostructure such as that depicted in FIG. 1.

Figure 5:
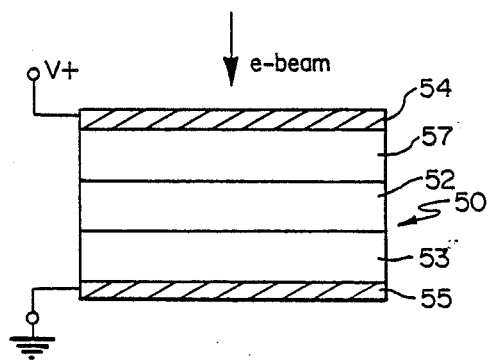
FIG. 5 is a section view similar to that of FIG. 1 for another embodiment of the invention, in which the efficiency of the device of FIG. 1 is enhanced by the addition of staircases.

Referring now to FIG. 5, there is shown a cross-section of another device of the invention 50, in which the active region between positive electrode 54 and grounded electrode 55 is divided into three sub-regions 51, 52 and 53, each of graded composition. For example, each of these three regions may be comprised of n-$ZnS_xSe_{1-x}$ where, for example, x increases from about 0.05 to about 0.3 in a uniform manner from the lower surface to the upper surface of each layer. The thickness of such a layer may be on the order of a few thousand Angstroms. Graded compositions may be produced by known epitaxial deposition techniques.

Figure 6:
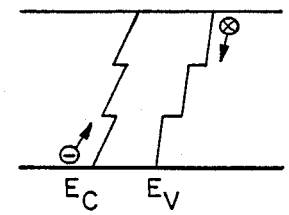
FIG. 6 is an energy diagram for the device of FIG. 5.

Such a layered structure of graded composition results in a continuous variation of band gap across the layers, which variation results in a so-called "staircase" structure. The energy diagram for such a structure is shown in FIG. 6. As may be seen the "steps" of the staircase are deeper in the valence band than in the conduction band. This is desirable in that it promotes formation of additional holes (the minority carriers in an n-type material). As the holes move from the positive towards the grounded electrode of the device, their valence band energy abruptly changes as they drop down the "steps", resulting in the production of additional holes, thereby increasing the minority carrier concentration and increasing the probability of electronhole pair recombinations, and consequent enhancement of light emission. It will be appreciated that where the active material is p-type rather than n-type, staircase structures can be designed to result in multiplication of electrons rather than holes.

Referring now to FIG. 7, there is shown a cross-section of another embodiment of a device 70 of the invention, in which the potential wells of FIG. 3 and the staircase structure of FIG. 5 are combined in a single active region to provide a further enhancement of efficiency in carrier production and recombination. Thus, staircase regions 71, 72 and 73 are present in the manner described for the device of FIG. 5, while the lowest staircase region 73 includes potential wells 74 ad 75.

The resulting energy diagram for such a device is depicted in FIG. 8. In operation of such a device, holes move from the positive electrode toward ground, producing additional holes as they move down the steps of the staircase, and then tending to become trapped in the potential wells in the lowest staircase region 73. Electrons moving away from the grounded electrode towards the positive electrode, also tend to become trapped in the potential wells, prior to encountering the steps of the staircase. As described previously, the trapped charge carriers tend to relax and recombine to produce light emission at enhanced efficiencies compared to untrapped carriers.

In the devices of FIGS. 1 through 7, separate carrier introduction is by means of an electron beam incident on the surface of the device. In FIG. 9, carrier introduction is achieved for a device similar to that of FIG. 7 by a carrier injection structure rather than an electron beam. In such device 90, a pn junction diode 91 is positioned atop the active region, the p+ and n+ regions being doped, for example, to have impurity levels within the range of $10^{18}$ to $10^{19}$ $1/cm^3$. The active region comprises staircase layers 92, 93 and 94, with layer 94 including potential wells 95 and 96. Electrode 97 positioned over the n+ region of the diode and electrode 98 positioned over the p+ region of the diode are each held at a positive potential, the potential on the electrode 97 being greater than that on electrode 98, with the bottom electrode 99 being held at ground potential.

The energy diagram for this device is shown in FIG. 10, in which the lower portion of the diagram is for the layers 92, 93 and 94, and is similar to that shown in FIG. 8. The upper portion of the diagram shows the variation in energy of the conduction and valence bands for the pn junction diode. As may be seen from the diagram, when reverse biased in the manner shown, the pn junction diode results in the injection of holes into the device.

By way of example, where the compositions of the active region are as described above for the devices of FIGS. 3 and 5, the overall thickness of the active region including layers 92, 93 and 94 is about 1 micron, the thickness of the n+ region is about 0.5 micron, and the thickness of the p region of the diode below the n region is from about 100 to 300 angstroms, impressing a potential of about 10 volts on electrode 97 and about 5 volts on electrode 98 will result in the injection of hot holes into the active region of the device.

The pn junction diode may be fabricated from any semiconductor material which is compatible with the materials chosen for the active region and which can be doped both n-type and p-type, such as, for example, silicon or gallium arsenide. In the alternative, a reverse biased Schottky diode may be used for carrier injection.

Of course, as will be appreciated by those skilled in the art, when p-type material is chosen for the active region of the device, a forward biased pn junction diode or Schottky diode should be employed to achieve injection of electrons into the active region of the device.

Referring now to FIG. 11, there is shown another embodiment of a device of the invention 100, in which an n-type single crystal semiconductor substrate 101 supports a single crystal p-type layer 102 of the same material and containing an n++region to form pn junction, for example, by thermal diffusion of impurities, as is known in the art. On this p-type layer 102 has been epitaxially grown over the pn junction an active region including graded composition layers 103, 106 and 107, with the layer 103 containing potential well layers 104 and 105. By way of example, layer 103 may be ZnSe laid down alternately with layers 104 and 105, each of layers 104 and 105 being ZnSSe. Layer 106 is entirely ZnSe and layer 107 is entirely ZnSSe. Growth of these layers can be restricted to the area over the pn junction by masking the remaining areas of the substrate 102, or can be on the entire surface of the substrate 102, after which portions are selectively removed, for example, by an etching process. Subsequently, electrodes 108, 109 and 110 are formed on the lower surface of the n-type substrate 101, the upper surface of the active region 107, and the upper surface of the p-type layer, respectively. Electrode 108 is positive, electrode 109 is negative and electrode 110 is grounded. The energy diagram for such a device is shown in FIG. 12.

By way of example, the thickness of the n++ region is about 0.5 microns, the thickness of the p region above the n++region is about 100 to 300 Angstroms, the thickness of the layer 112 is about 0.2 to 0.3 microns, the thickness of the potential wells 103, 104 and 105 in layer 112 are about 30 Angstroms each, and the thickness of the layers 106 and 107 is about 0.1 to 0.2 microns each.

Figure 15:
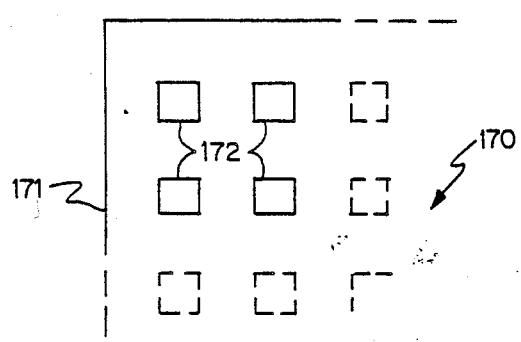
FIG. 15 is a plan view of another embodiment of the invention, showing a portion of an array of LED's in accordance with the invention suitable for use in a display device.

The configuration of FIG. 11 may be employed in the production of an array of LED's on a single crystal substrate. Such an array is partially shown in FIG. 15, where substrate 171 supports devices 172, which may be similar in construction to that shown in FIG. 11. In the production of such an array, an array of pn junctions is first formed in the substrate using photolithographic masking, thermal diffusion and epitaxial growth techniques well known in the integrated circuit art. Subsequently, the active regions of the devices are formed epitaxially, either by first masking the substrate surface to expose only those areas over the diodes where active material is desired, then growing the epitaxial layers on the exposed areas, and then removing the masking material, or alternatively by growing the epitaxial layers over the entire surface of the substrate, and then subsequently removing portions of the layers, such as by photolithographic masking and selective etching techniques, to leave active material in the areas over the diodes. Subsequently, the electrodes are formed. Such arrays may find use, for example, in the production of display devices in which video or other information is displayed by separately addressing the individual LED's in the array.

Figure 13:
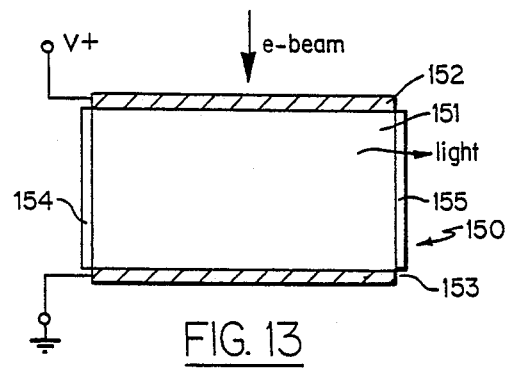
FIG. 13 is a section view of another embodiment of the invention, in which Fabry-Perot surfaces are added to the active region of the device of FIG. 1.

Referring now to FIG. 13, there is shown another embodiment of a device 150 in accordance with the invention, the device being similar to that shown in FIG. 1 except that Fabry-Perot surfaces 154 and 155 have been placed in parallel relationship on opposing surfaces of the active region 151. As is known, such surfaces form a Fabry-Perot cavity for the amplification of light waves trapped within the cavity, and the subsequent emission of laser light from the device, as indicated by the wavy arrow. In this embodiment, the normal to the Fabry-Perot surfaces is parallel to the electrode surfaces 152 and 153, so that attenuation or absorption of the laser light which could otherwise occur upon passage of such light through the electrode material, is avoided.

Figure 14:
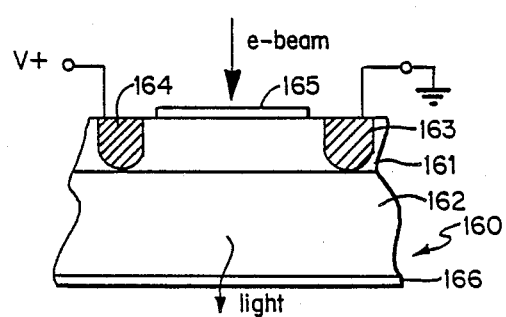
FIG. 14 is a section view of another embodiment of the invention, in which Fabry-Perot surfaces are located on the active region between electrodes and on a substrate material.

FIG. 14 illustrates another embodiment of a laser device 160 of the invention. In this device 160, a layer of active material 161 is deposited on a suitable substrate 162, after which channels are etched in the active material 161 and filled with electrode material to form electrodes 163 and 164. Subsequently, Fabry-Perot surfaces are formed by depositing reflective layers 165 and 166 on the outer surfaces of the active material 161 and the substrate 162 respectively. A positive voltage impressed on electrode 164 subjects the active material between the electrodes to a potential just below that required for avalanche breakdown. Subsequent impingment of an electron beam on the active material 161 through the reflective layer 165 achieves carrier multiplication by avalanche breakdown. Recombination of the carriers results in light emission which oscillates between reflective layers 165 and 166 to achieve light amplification and laser output as indicated by the wavy arrow. This arrangement may find use in the production of an array of such devices on a substrate. Such an array may be particularly suitable for use in display applications where a constant bias voltage impressed on the array would permit display of video information by scanning the array with a modulated electron beam having sufficient energy to excite laser output. Thus, in contrast to the device of FIG. 11, individual addressing of each element of the array is avoided.

I claim:

1. Wide band gap, single conductivity type semiconductor light emitting device, the device having at least two electrodes and an active region between the electrodes, the active region including a carrier recombination region and comprising an essentially single crystal semiconductor compound of a single conductivity type selected from the group of II-VI and III-V semiconductor compounds and mixed compounds, characterized in that separate means for carrier introduction into the active region is provided, whereby in operation, application of a bias potential across the electrodes below that required for carrier multiplication by avalanche breakdown enables excitation of light emission by separate carrier introduction at a lower energy than would be required without the bias potential.

2. The device of claim 1 in which the active region includes at least one potential well.

3. The device of claim 2 in which the composition of the active region is n-type $ZnS_xSe_{1-x}$ and the composition of the potential well is n-type ZnSe.

4. The device of claim 2 in which the composition of the active region is n-type $Al_xGa_{1-x}N$, and the composition of the potential well is n-type GaN.

5. The device of claim 1 in which the active region includes at least one staircase region.

6. The device of claim 5 in which the composition of the active region corresponds to the formula n-type $ZnS_xSe_{1-x}$, and the composition changes uniformly across the staircase region.

7. The device of claim 6 in which the value of x across the staircase region ranges from a low of about 0.05 to a high of about 0.3.

8. The device of claim 1 in which the active region includes at least one potential well and at least one staircase region.

9. The device of claim 8 in which the potential well is located within the staircase region.

10. The device of claim 1 in which separate carrier introduction is achieved by impingment of an electron beam on one surface of the device.

11. The device of claim 1 in which separate carrier introduction is achieved by a carrier injection structure on one surface of the active region.

12. The device of claim 11 in which the carrier injection structure is a pn junction diode.

13. The device of claim 11 in which at least one carrier injection structure is located in a single crystal semiconductor substrate, and at least one active region comprising one or more epitaxial layers is located over the carrier injection structure on the substrate.

14. The device of claim 13 in which the carrier injection structure is a pn junction diode.

15. The device of claim 14 in which the substrate material is selected from the group consisting of single crystal silicon and gallium arsenide.

16. The device of claim 13 in which the substrate contains an array of spaced apart carrier injection structures and in which the substrate supports an array of active regions located over the carrier injection structure array.

17. The device of claim 1 in which a pair of parallel reflective surfaces are provided to form a Fabry-Perot cavity for at least the recombination region of the active region, thereby to promote amplification and lasing of the emitted light.

18. The device of claim 17 in which the electrodes have mutually parallel surfaces and the normal to the parallel reflective surfaces is parallel to the electrode surfaces, so that the electrodes are located outside the path of the laser light.

* * * * *